(12) United States Patent
Chen et al.

(10) Patent No.: US 9,319,772 B2
(45) Date of Patent: Apr. 19, 2016

(54) MULTI-FLOOR TYPE MEMS MICROPHONE

(71) Applicant: MERRY ELECTRONICS (SHENZHEN) CO., LTD., Shenzhen (CN)

(72) Inventors: Jen-Yi Chen, Taichung (TW); Chao-Sen Chang, Taichung (TW); Chun-Chieh Wang, Taichung (TW); Yong-Shiang Chang, Taichung (TW)

(73) Assignee: MERRY ELECTRONICS (SHENZHEN) CO., LTD., Shenzhen (CN)

( * ) Notice: Subject to any disclaimer, the term of this patent is extended or adjusted under 35 U.S.C. 154(b) by 40 days.

(21) Appl. No.: 14/310,723

(22) Filed: Jun. 20, 2014

(65) Prior Publication Data

US 2015/0373446 A1 Dec. 24, 2015

(51) Int. Cl.
| | |
|---|---|
| *H04R 3/00* | (2006.01) |
| *H04R 1/28* | (2006.01) |
| *H04R 1/04* | (2006.01) |
| *B81B 7/00* | (2006.01) |
| *H04R 19/00* | (2006.01) |
| *H04R 19/04* | (2006.01) |

(52) U.S. Cl.
CPC .............. *H04R 1/28* (2013.01); *B81B 7/0032* (2013.01); *H04R 1/04* (2013.01); *H04R 19/005* (2013.01); *H01L 2224/48137* (2013.01); *H01L 2224/48221* (2013.01); *H04R 19/04* (2013.01); *H04R 2201/003* (2013.01)

(58) Field of Classification Search
None
See application file for complete search history.

(56) References Cited

U.S. PATENT DOCUMENTS

| | | | | |
|---|---|---|---|---|
| 8,184,845 | B2 * | 5/2012 | Leidl et al. | 381/369 |
| 9,253,579 | B2 * | 2/2016 | Formosa | H04R 19/005 |
| 2007/0205492 | A1 * | 9/2007 | Wang | 257/659 |
| 2011/0293126 | A1 * | 12/2011 | Maekawa et al. | 381/355 |
| 2012/0212925 | A1 * | 8/2012 | Zoellin et al. | 361/807 |

\* cited by examiner

*Primary Examiner* — Andrew L Sniezek
(74) *Attorney, Agent, or Firm* — Bacon & Thomas, PLLC

(57) ABSTRACT

A multi-floor type MEMS microphone includes a housing formed by a stack of circuit boards and provided with a first cavity, a second cavity in vertical communication with the first cavity, and a sound hole in communication with the second cavity. The second cavity has a vertical cross-sectional area smaller than that of the first cavity. A MEMS transducer is disposed in the second cavity and electrically conducted with the housing, and an ASIC chip is disposed in the first cavity and electrically conducted with the housing. By this design, the volume of the back chamber of a vibrating diaphragm of the MEMS transducer can be increased in a limited space of the housing, and thus the sensitivity of the microphone can be improved.

12 Claims, 3 Drawing Sheets

MULTI-FLOOR TYPE MEMS MICROPHONE

BACKGROUND OF THE INVENTION

1. Field of the Invention

The present invention relates to micro-electromechanical system (hereinafter referred to as 'MEMS') microphones, and more particularly to a multi-floor type MEMS microphone having an improved sensitivity.

2. Description of the Related Art

The MEMS microphone is a capacitive-sensing device that combines two main components, namely a MEMS transducer and an application-specific integrated circuit (hereinafter referred to as 'ASIC') chip, in an acoustic housing. Compared to conventional capacitance microphones, the MEMS microphone has the advantages of small size, low power consumption and inert to the interfering factors from the ambient environment, such as temperature change, external vibrations or electromagnetic interference.

FIG. 1 illustrates a conventional package structure 1 that comprises a housing 4 formed by a substrate 2 and a cap 3 mounted on the substrate 2. The cap 3 is employed to protect the MEMS transducer 5 and the ASIC chip 6, both of which are mounted on the substrate 2. However, because of the structural design, the volume of the back chamber 8, which is the space defined by the vibrating diaphragm 7 of the MEMS transducer 5 and the substrate 2, is limited. As a result, the sensitivity may also be limited or unsatisfied. Therefore, the package structure needs to be improved.

SUMMARY OF THE INVENTION

The present invention has been accomplished under the circumstance in view. The main object of the invention is to provide a multi-floor type MEMS microphone, which greatly increases the volume of the back chamber in a limited housing space so as to effectively improve sensitivity thereof.

To attain the above mention, the MEMS microphone provided by the present invention comprises a housing, a MEMS transducer and an ASIC chip. The housing is formed by a plurality of circuit boards that are stacked together. The housing has a first cavity, a second cavity vertically communicated with the first cavity, and a sound hole communicated with the second cavity. The second cavity has a vertical cross-sectional area that is smaller than that of the first cavity. The MEMS transducer is posited/mounted in the second cavity and electrically conducted with the housing. The ASIC is posited/mounted in the first cavity and electrically conducted with the housing. By means of this design, the limited internal space of the housing is fully and effectively utilized to optimally increase the volume of the back chamber, thereby increasing the sensitivity of the microphone.

Preferably, the MEMS transducer is posited in a center of the second cavity, and the ASIC chip is posited on a corner of the first cavity in such a way that the MEMS transducer and the ASIC chip are vertically arranged in a stagger manner. By means of this arrangement, the MEMS microphone of the present invention may have a minimized footing area of the housing, but enhanced volume of the back chamber.

Preferably, the housing is provided at an interface portion between the first cavity and the second cavity with a first bearing portion, a second bearing portion opposite to the first bearing portion, a third bearing portion connected between the first bearing portion and the second bearing portion, and a fourth bearing portion opposite to the third bearing portion and connected with the first and second bearing portions. More preferably, the first bearing portion may have a width substantially equal to that of the second bearing portion, and the third bearing portion may have a width larger than that of the fourth bearing portion. Further, the ASIC chip may have a long side and a short side, which are mounted on the first bearing portion and the third bearing portion, respectively.

Other advantages and features of the present invention will be fully understood by reference to the following specification in conjunction with the accompanying drawings, in which like reference signs denote like components of structure.

DETAILED DESCRIPTION OF THE INVENTION

Figure 2:
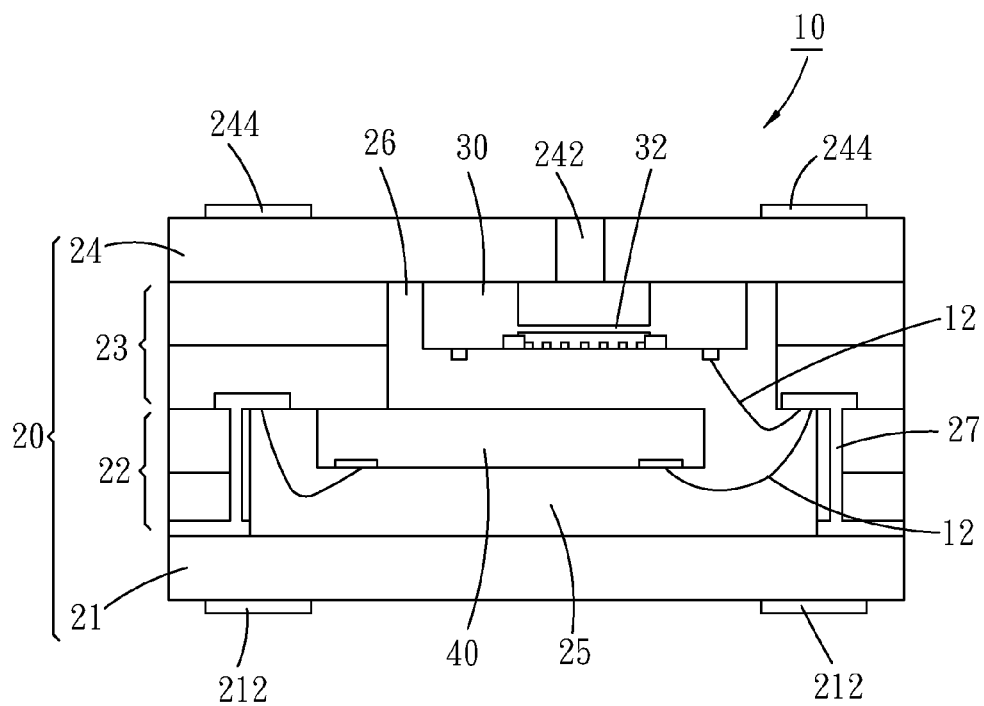
FIG. 2 is a schematic vertical sectional view of a multi-floor type MEMS microphone in accordance with a first embodiment of the present invention.

Referring to FIG. 2, a multi-floor type MEMS microphone 10 in accordance with a first embodiment of the present invention is shown. As illustrated, the multi-floor type MEMS microphone 10 comprises a housing 20, a MEMS transducer 30, and an ASIC chip 40.

Figure 1:
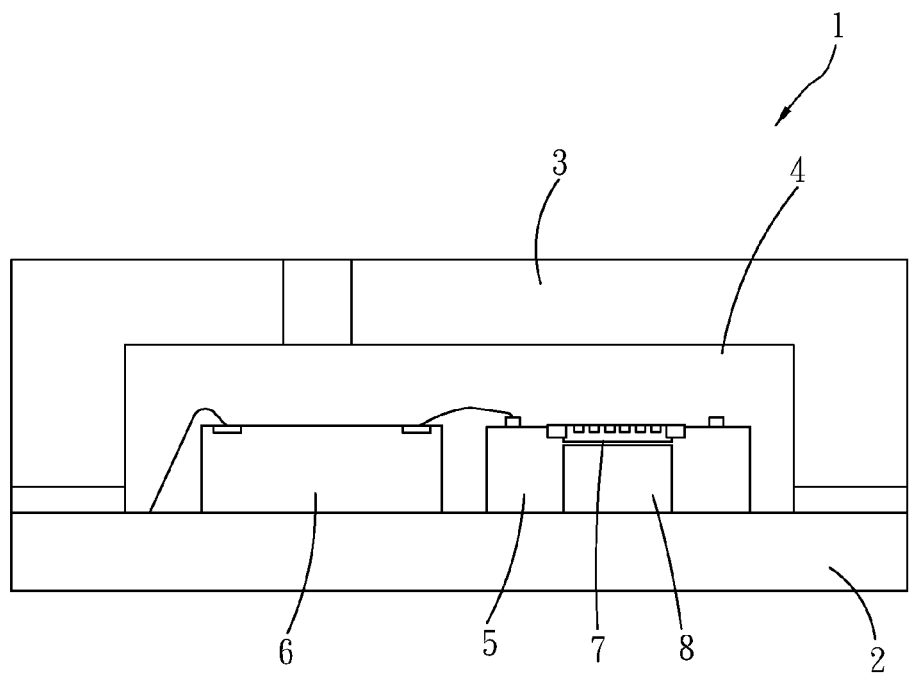
FIG. 1 is a schematic vertical sectional view of a package structure of a MEMS microphone according to the prior art.
Figure 3:
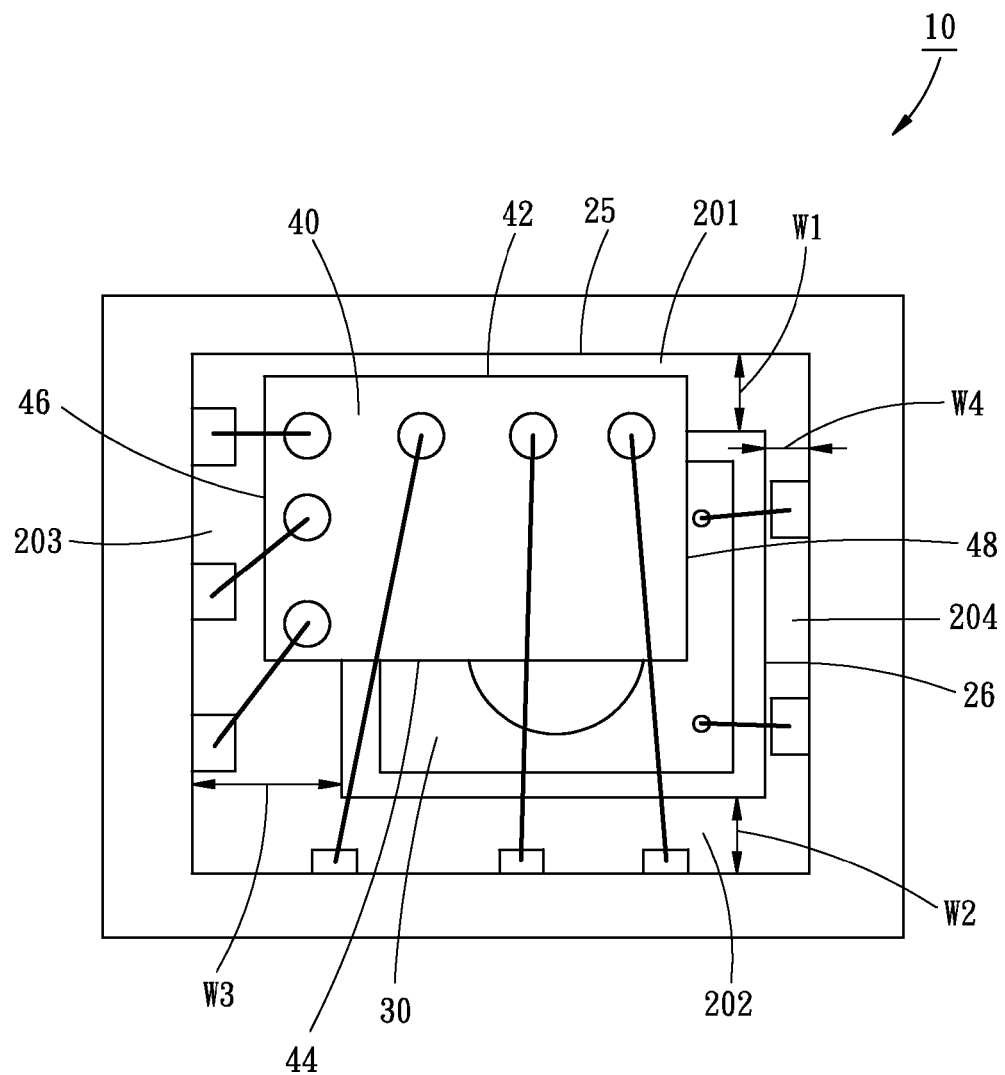
FIG. 3 is a schematic horizontal sectional view of the multi-floor type MEMS microphone in accordance with the first embodiment of the present invention.

The housing 20 is composed of multiple circuit boards stacked together. In this embodiment, the housing 20 comprises a first circuit board 21, a plurality of second circuit boards 22, a plurality of third circuit boards 23 and a fourth circuit board 24, which are orderly stacked one after another. The first circuit board 21 and the second circuit boards 22 define therebetween a first cavity 25, and the third circuit boards 23 and the fourth circuit board 24 define therebetween a second cavity 26 which is in vertical communication with the first cavity 25. As shown in FIG. 3, a schematic of the MEMS microphone 10, the vertical cross-sectional area of the second cavity 26 is smaller than the vertical cross-sectional area of the first cavity 25. The interface portion between the first cavity 25 and the second cavity 26 is configured having a first bearing portion 201, a second bearing portion 202 opposite to the first bearing portion 201, a third bearing portion 203 connected between the first bearing portion 201 and the second bearing portion 202, and a fourth bearing portion 204 opposite to the third bearing portion 203 and connected between the first bearing portion 201 and the second bearing portion 202 in such a way that the width W1 of the first bearing portion 201 is substantially equal to the width W2 of the second bearing portion 202, and the width W3 of the third bearing portion 203 is larger than the width W4 of the fourth bearing portion 204. Further, the first circuit board 21 comprises a plurality of solder pads 212 located on one side (namely, the bottom side) thereof opposite to the second circuit boards 22 (see FIG. 1). Furthermore, the fourth circuit board 24 comprises a plurality of solder pads 244 located on one side (namely, the top side) thereof opposite to the third circuit board 23. The solder pads 212 and 244 are adapted for external connection. As shown in FIG. 2, the fourth circuit board 24 is provided with a sound hole 242 serving as an entrance of external sound waves.

The MEMS transducer 30 is located at the center of the second cavity 26 and mounted on the fourth circuit board 24 of the housing 20. By means of bonding wires 12 connected between the top of the MEMS transducer 30 and a first trace layer 27 extending from the third circuit boards 23 to the first circuit board 21 through the second circuit boards 22, the MEMS transducer 30 and the housing 20 are electrically connected with each other. Further, the MEMS transducer 30 comprises a vibrating diaphragm 32 corresponding in location to the sound hole 242 of the fourth circuit board 24. Whenever the vibrating diaphragm 32 of the MEMS transducer 30 receives a sound pressure, a corresponding deformation of the vibrating diaphragm 32 is performed and the MEMS transducer 30 converts the sound pressure into a capacitance change.

The ASIC chip 40 is adapted to provide a stable bias voltage to the MEMS transducer 30 and to output the processed signal. As illustrated in FIG. 2 and FIG. 3, the ASIC chip 40 has one long side 42 mounted on the first bearing portion 201 of the housing 20, and one short side 46 mounted on the third bearing portion 203 in such a way that the major parts of the other long side 44 and the other short side 48 are thus suspended in the first cavity 25. As shown in FIG. 3, the ASIC chip 40, which is located at a corner of the first cavity 25 as mounted on the first and second bearing portions 201 and 203, is vertically staggered relative to the MEMS transducer 30. By means of a plurality of bonding wires 12 connected between the ASIC chip 40 and the first trace layer 27, the electric connection between the ASIC chip 40 and the housing 20 is established.

From the structure described above, it can be seen that the multi-floor type MEMS microphone 10, which uses the housing 20 formed by a stack of circuit boards for facilitating the MEMS transducer 30 and the ASIC chip 40 to be vertically arranged in a stagger manner at different elevations inside the housing 20, can minimize the footing area of the housing 20, and even the size of the microphone 10. On the other hand, the volume of the back chamber of the MEMS transducer 30 can be increased. Thus, the sensitivity of the microphone 10 can be improved.

Figure 4:
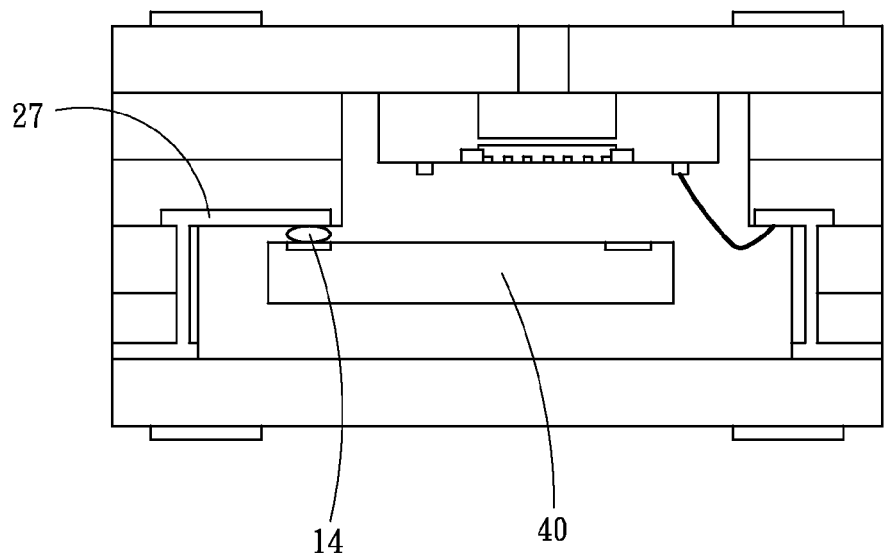
FIG. 4 is a schematic vertical sectional view of a multi-floor type MEMS microphone in accordance with a second embodiment of the present invention.
Figure 5:
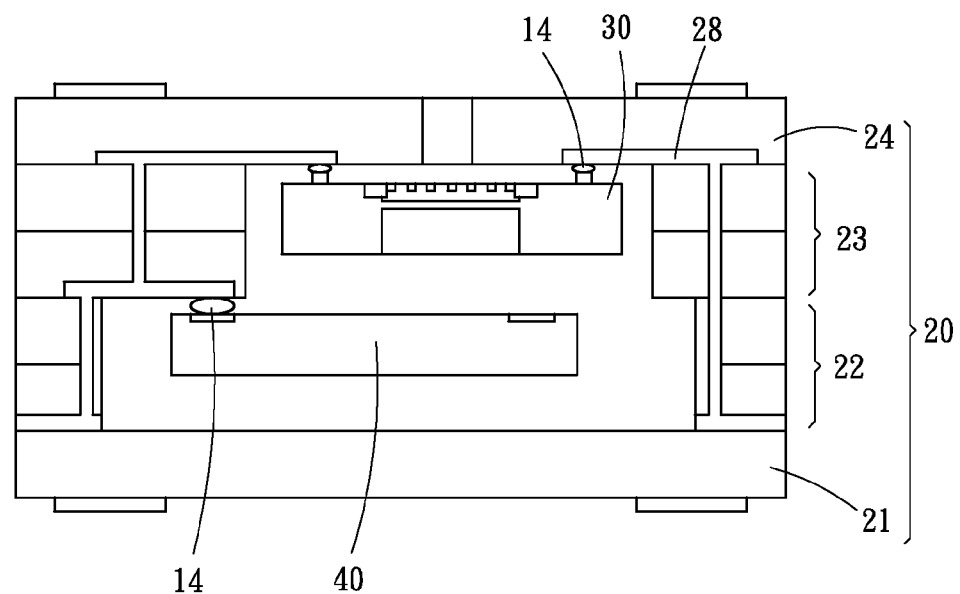
FIG. 5 is a schematic vertical sectional view of a multi-floor type MEMS microphone in accordance with a third embodiment of the present invention.

Further, it is to be noted that the electrical conduction between the MEMS transducer 30 and the housing 20 and the electrical conduction between the ASIC chip 40 and the housing 20 can be achieved in many other ways. For example, in a second embodiment of the present invention as illustrated in FIG. 4, the ASIC chip 40 has a plurality of conducting bumps 14 formed by flip chip technology. The conducting bumps 14 of the ASIC chip 40 are electrically connected with the first trace layer 27, such that the electrical conduction between the ASIC chip 40 and the housing 20 is realized. In a third embodiment of the present invention as illustrated in FIG. 5, the MEMS transducer 30 has a plurality of conducting bumps 14 formed by flip chip technology. The conducting bumps 14 are electrically connected with a second trace layer 28 of the housing 20. The second trace layer 28 extends from the fourth circuit board 24 to the first circuit board 21 through the third circuit boards 23 and the second circuit boards 22. Thus, an electrical conduction is established between the MEMS transducer 30 and the housing 20.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A multi-floor type micro-electromechanical system (MEMS) microphone, comprising:
    a housing formed by a stack of a first circuit board, a plurality of second circuit boards, a plurality of third circuit boards and a fourth circuit board and provided with a first cavity, a second cavity vertically communicated with the first cavity and having a vertical cross-sectional area smaller than a vertical cross-sectional area of the first cavity, and a sound hole disposed at the first circuit board or the fourth circuit board;
    a MEMS transducer posited in the housing and electrically connected with the housing via a first trace layer; and
    an application-specific integrated circuit (ASIC) chip posited in the housing and electrically connected with the housing;
    wherein the plurality of second circuit boards and the plurality of third circuit boards are sandwiched in between the first circuit board and the fourth circuit board, and the first trace layer is extended through at least one of the plurality of the second circuit boards and the plurality of third circuit boards.

2. The multi-floor type MEMS microphone as claimed in claim 1, wherein the MEMS transducer and the ASIC chip are vertically arranged in a stagger manner.

3. The multi-floor type MEMS microphone as claimed in claim 2, wherein the housing comprises a plurality of bearing portions provided at an interface portion between the first cavity and the second cavity for mounting thereon the ASIC chip.

4. The multi-floor type MEMS microphone as claimed in claim 1, wherein the first cavity is defined between the second circuit boards and the first circuit board, and the second cavity is defined between the third circuit boards and the fourth circuit board.

5. The multi-floor type MEMS microphone as claimed in claim 4, wherein the first circuit board is provided at a side opposite to the second circuit boards with a plurality of solder pads; the fourth circuit board is provided at a side opposite to the third circuit boards with a plurality of solder pads.

6. The multi-floor type MEMS microphone as claimed in claim 1, wherein the MEMS transducer comprises a vibrating diaphragm corresponding in location to the sound hole.

7. The multi-floor type MEMS microphone as claimed in claim 1, wherein the MEMS transducer is electrically connected with the housing by wire bonding.

8. The multi-floor type MEMS microphone as claimed in claim 1, wherein the MEMS transducer is electrically connected with the housing by flip-chip via a plurality of conducting bumps.

9. The multi-floor type MEMS microphone as claimed in claim 1, wherein the ASIC chip is electrically connected with the housing by wire bonding.

10. The multi-floor type MEMS microphone as claimed in claim 1, wherein the ASIC chip is electrically connected with the housing by flip-chip via a plurality of conducting bumps.

11. The multi-floor type MEMS microphone as claimed in claim 1, wherein the housing has a second trace layer extending from the fourth circuit board to the first circuit board and through the third circuit boards and the second circuit boards.

12. The multi-floor type MEMS microphone as claimed in claim 4, wherein the MEMS transducer is located at the second cavity and mounted on the fourth circuit board, and the ASIC chip is located at the first cavity and mounted on one of the third circuit boards.

* * * * *